(12) United States Patent
Lim et al.

(10) Patent No.: US 9,972,242 B2
(45) Date of Patent: May 15, 2018

(54) PIXEL AND ORGANIC LIGHT EMITTING DISPLAY DEVICE USING THE SAME

(71) Applicant: Samsung Display Co., Ltd., Yongin-si, Gyeonggi-do (KR)

(72) Inventors: Jae Keun Lim, Yongin-si (KR); Hee Rim Song, Yongin-si (KR); Mu Kyung Jeon, Yongin-si (KR); Chong Chul Chai, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 10 days.

(21) Appl. No.: 15/078,876

(22) Filed: Mar. 23, 2016

(65) Prior Publication Data

US 2016/0372037 A1   Dec. 22, 2016

(30) Foreign Application Priority Data

Jun. 16, 2015   (KR) .................. 10-2015-0085442

(51) Int. Cl.
*G09G 3/3233* (2016.01)
*H01L 27/32* (2006.01)

(52) U.S. Cl.
CPC ....... *G09G 3/3233* (2013.01); *H01L 27/3262* (2013.01); *H01L 27/3265* (2013.01); *H01L 27/3276* (2013.01); *G09G 2300/0819* (2013.01); *G09G 2300/0842* (2013.01); *G09G 2300/0861* (2013.01); *G09G 2310/08* (2013.01); *G09G 2320/0214* (2013.01); *G09G 2320/0219* (2013.01); *G09G 2320/0233* (2013.01)

(58) Field of Classification Search
CPC ... G09G 2300/0819; G09G 2300/0842; G09G 2300/0861; G09G 2310/08; G09G 2320/0214; G09G 2320/0219; G09G 2320/0233; G09G 3/3233; H01L 27/3262; H01L 27/3265; H01L 27/3276
See application file for complete search history.

(56) References Cited

U.S. PATENT DOCUMENTS 7,202,606 B2 * 4/2007 Eom .................... G09G 3/3233
                                                                    315/169.3
8,803,770 B2    8/2014 Jeong et al.
(Continued)

FOREIGN PATENT DOCUMENTS

KR   10-2012-0002070 A   1/2012
KR   10-2012-0008085 A   1/2012
KR   10-2014-0096862 A   8/2014

*Primary Examiner* — Kenneth Bukowski
(74) *Attorney, Agent, or Firm* — Lewis Roca Rothgerber Christie LLP

(57) ABSTRACT

A pixel includes: an organic light emitting diode including a cathode electrode connected to a second power source; a first transistor including a first electrode connected to a first power source, and to control an amount of current flowing from the first power source to the second power source via the organic light emitting diode in response to a data signal; a plurality of second transistors connected in series between a gate electrode of the first transistor and an initialization power source, and to be turned on when a scan signal is supplied to an i–1-th (i is a natural number) scan line; and a first capacitor connected between a voltage source and a first node, the first node being between the plurality of second transistors.

16 Claims, 9 Drawing Sheets

(56) References Cited

U.S. PATENT DOCUMENTS

| | | | |
|---|---|---|---|
| 2004/0144978 A2* | 7/2004 | Koyama | G09G 3/3241 |
| | | | 257/59 |
| 2008/0106207 A1* | 5/2008 | Yoon | G09G 3/3233 |
| | | | 315/158 |
| 2008/0224965 A1* | 9/2008 | Kim | G09G 3/3233 |
| | | | 345/76 |
| 2012/0001896 A1* | 1/2012 | Han | G09G 3/3233 |
| | | | 345/214 |
| 2014/0210867 A1* | 7/2014 | Kwon | G09G 3/3258 |
| | | | 345/690 |

* cited by examiner

PIXEL AND ORGANIC LIGHT EMITTING DISPLAY DEVICE USING THE SAME

CROSS-REFERENCE TO RELATED APPLICATION

This application claims priority to and the benefit of Korean Patent Application No. 10-2015-0085442, filed on Jun. 16, 2015, in the Korean Intellectual Property Office, the entire contents of which are incorporated herein by reference in their entirety.

BACKGROUND

1. Field

One or more aspects of example embodiments relate to a pixel, and an organic light emitting display device including the same.

2. Description of the Related Art

With the development of information technology, importance on display devices has been highlighted, and in response to this trend, flat panel display devices, such as a liquid crystal display device, an organic light emitting display device, and/or a plasma display panel, have been widely used.

The organic light emitting display device, from among the flat panel display devices, displays an image by using organic light emitting diodes that generate light by recoupling electrons and holes. The organic light emitting display device has a fast response speed and may be driven with low power consumption.

The organic light emitting display device includes a plurality of pixels arranged in a matrix form at crossing regions (or crossing areas) of a plurality of data lines, scan lines, and power supply lines. Each pixel generally includes an organic light emitting diode, two or more transistors including a driving transistor, and one or more capacitors.

The organic light emitting display device has low power consumption, but the amount of current flowing in the organic light emitting diode may change according to a threshold voltage variation of the driving transistor included in each of the pixels, and thus, display non-uniformity may occur. Accordingly, a method of compensating a threshold voltage of the driving transistor by diode-connecting the driving transistor has been proposed.

However, when the driving transistor is diode-connected, current paths are formed between a gate electrode of the driving transistor and an initialization power, and between the gate electrode of the driving transistor and a common node that is between a first power and the organic light emitting diode.

It may be desirable for the gate electrode of the driving transistor to maintain a uniform voltage during one frame period, but because the above described current paths may change a voltage of the gate electrode of the driving transistor, luminance of the pixels may change during one frame period.

The above information disclosed in this Background section is only for enhancement of understanding of the background of the present invention, and therefore, it may contain information that does not constitute prior art.

SUMMARY

One or more example embodiments are directed to providing a pixel capable of ensuring uniformity of luminance, and an organic light emitting display device including the same.

According to an exemplary embodiment of the present invention, a pixel includes: an organic light emitting diode including a cathode electrode connected to a second power source; a first transistor including a first electrode connected to a first power source, and configured to control an amount of current flowing from the first power source to the second power source via the organic light emitting diode in response to a data signal; a plurality of second transistors connected in series between a gate electrode of the first transistor and an initialization power source, and configured to be turned on when a scan signal is supplied to an i−1-th (i is a natural number) scan line; and a first capacitor connected between a voltage source and a first node, the first node being between the plurality of second transistors.

The first capacitor may have a capacitance higher than that of a parasitic capacitor formed between the first node and the i−1-th scan line.

The voltage source may be set to any one from among the first power source, the second power source, and the initialization power source.

The pixel may further include: a plurality of third transistors connected in series between the gate electrode of the first transistor and a second electrode of the first transistor, and configured to be turned on when a scan signal is supplied to an i-th scan line.

The pixel may further include: a second capacitor connected between the i-th scan line and a second node, the second node being between the plurality of third transistors.

The pixel may further include: a fourth transistor connected to a data line and the first electrode of the first transistor, and configured to be turned on when a corresponding scan signal is supplied to an i-th scan line; a fifth transistor connected to the initialization power source and an anode electrode of the organic light emitting diode, and configured to be turned on when a scan signal is supplied to a j-th (j is a natural number) scan line; a sixth transistor connected to the first power source and the first electrode of the first transistor, and configured to be turned off when a light emission control signal is supplied to an i-th light emission control line; a seventh transistor connected to the second electrode of the first transistor and the anode electrode of the organic light emitting diode, and configured to be turned off when the light emission control signal is supplied to the i-th light emission control line; and a storage capacitor connected between the gate electrode of the first transistor and the first power source.

The scan signal supplied to the j-th scan line may overlap with the light emission control signal supplied to the i-th light emission control line.

According to another exemplary embodiment of the present invention, an organic light emitting display device includes: a scan driver configured to supply scan signals to scan lines and light emission control signals to light emission control lines; a data driver configured to supply data signals to data lines; and pixels arranged at crossing regions of the scan lines and the data lines, each of the pixels arranged at an i-th (i is a natural number) horizontal line from among the pixels including: an organic light emitting diode including a cathode electrode connected to a second power source; a first transistor including a first electrode connected to a first power source, and configured to control an amount of current flowing from the first power source to the second power source via the organic light emitting diode in response to a corresponding data signal; a plurality of second transistors connected in series between a gate electrode of the first transistor and an initialization power source, and configured to be turned on when a corresponding scan signal is supplied to an i−1-th (where i is a natural number) scan line; and a first capacitor connected between a voltage source and a first node, the first node being between the plurality of second transistors.

The first capacitor may have a capacitance higher than that of a parasitic capacitor formed between the first node and the i−1-th scan line.

The voltage source may be set to any one from among the first power source, the second power source, and the initialization power source.

The scan driver may be configured to sequentially supply the scan signals having gate-on voltages to the scan lines, and to sequentially supply the light emission control signals having gate-off voltages to the light emission control lines.

The scan driver may be configured to supply the light emission control signals to an i-th light emission control line to overlap with the scan signals supplied to the i−1-th scan line and an i-th scan line.

Each of the pixels arranged at the i-th horizontal line may further include a plurality of third transistors connected in series between a gate electrode of the first transistor and a second electrode of the first transistor, and configured to be turned on when a corresponding scan signal is supplied to an i-th scan line.

Each of the pixels arranged at the i-th horizontal line may further include a second capacitor connected between the i-th scan line and a second node, the second node being between the plurality of third transistors.

Each of the pixels arranged at the i-th horizontal line may further include: a fourth transistor connected to a data line and the first electrode of the first transistor, and configured to be turned on when a corresponding scan signal is supplied to an i-th scan line; a fifth transistor connected to the initialization power source and an anode electrode of the organic light emitting diode, and configured to be turned on when a corresponding scan signal is supplied to a j-th (j is a natural number) scan line; a sixth transistor connected to the first power source and the first electrode of the first transistor, and configured to be turned off when a light emission control signal is supplied to an i-th light emission control line; a seventh transistor connected to the second electrode of the first transistor and the anode electrode of the organic light emitting diode, and configured to be turned off when the light emission control signal is supplied to the i-th light emission control line; and a storage capacitor connected between the gate electrode of the first transistor and the first power source.

The scan signal supplied to the j-th scan line may overlap with the light emission control signal supplied to the i-th light emission control line.

According to one or more exemplary embodiments of the present invention, the second transistors may be provided between the gate electrode of the driving transistor and the initialization power, and the capacitor may be provided between the common node of the second transistors and the constant voltage source. The capacitor may set a voltage of the common node to be lower than that of the gate electrode of the driving transistor, and therefore the voltage of the gate electrode of the driving transistor may be uniformly maintaining during one frame period. In other words, the gate electrode of the driving transistor may maintain a substantially uniform voltage for current flowing thereto and therefrom, and thus, image display with uniform luminance may be possible.

BRIEF DESCRIPTION OF THE DRAWINGS

The above and other aspects and features of the present invention will become apparent to those skilled in the art from the following detailed description of the example embodiments with reference to the accompanying drawings.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
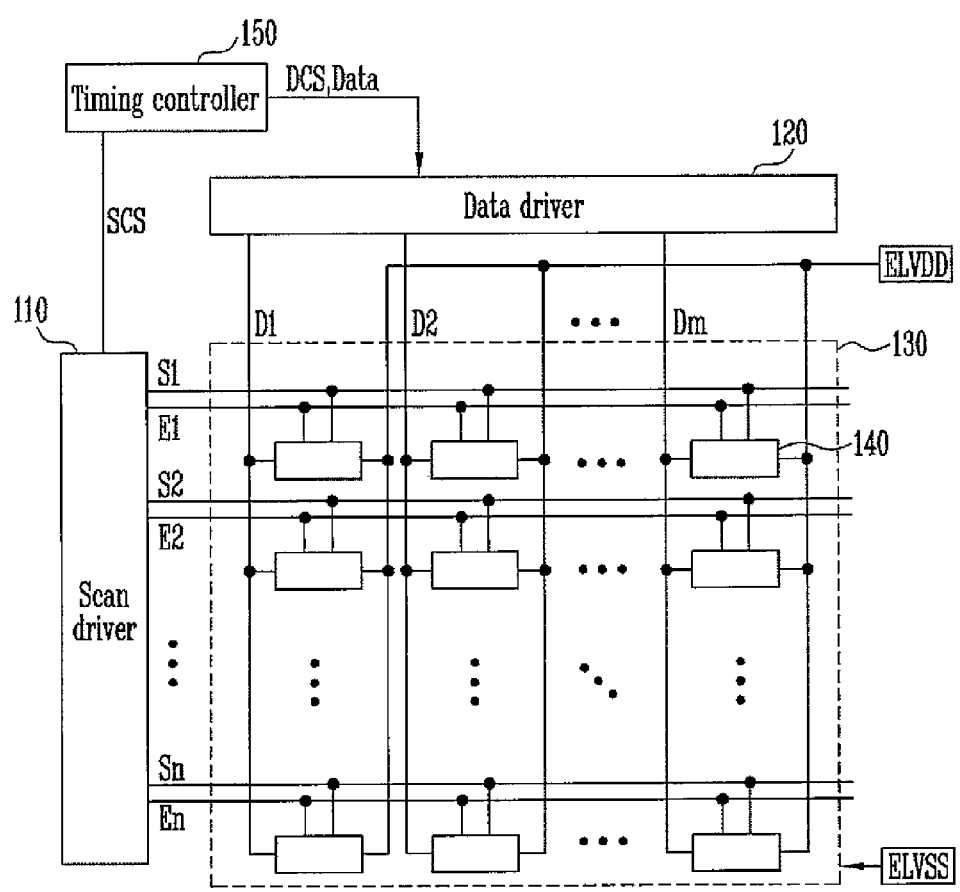
FIG. 1 illustrates an organic light emitting display device according to an exemplary embodiment of the present disclosure.

The present invention may be understood more readily by reference to the following detailed description of example embodiments and the accompanying drawings. However, the present invention may be embodied in various different forms, and should not be construed as being limited to the embodiments set forth herein. Rather, these embodiments are provided so that this disclosure will be through and complete, and will fully convey the aspects and features of the present invention to those skilled in the art. Accordingly, processes, elements, and techniques that are not necessary to those having ordinary skill in the art for a complete understanding of the present invention may not be described.

Throughout this specification and the claims that follow, when an element or layer is referred to as being "on," "connected to," or "coupled to" another element or layer, it can be directly on, connected to, or coupled to the other element or layer, or one or more intervening elements or layers may be present. Unless otherwise noted, like reference numerals denote like elements throughout the attached drawings and the written description, and thus, descriptions thereof may not be repeated.

In the drawings, the relative sizes of elements, layers, and regions may be exaggerated for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a view of an organic light emitting display device according to an exemplary embodiment of the present disclosure.

Referring to FIG. 1, the organic light emitting display device according to some exemplary embodiments of the present disclosure includes a pixel portion (e.g., a display unit) 130, a scan driver 110, a data driver 120, and a timing controller 150. The pixel portion 130 may include pixels 140 arranged at crossing regions of scan lines S1 to Sn and data lines D1 to Dm. The scan driver 110 may drive the scan lines S1 to Sn and light emission control lines E1 to En. The data driver 120 may drive the data lines D1 to Dm. The timing controller 150 may control the scan driver 110 and the data driver 120.

The timing controller 150 generates a data driving control signal DCS and a scan driving control signal SCS, in response to externally supplied synchronization signals. The data driving control signal DCS generated by the timing controller 150 is supplied to the data driver 120, and the scan driving control signal SCS generated by the timing controller 150 is supplied to the scan driver 110. The timing controller 150 rearranges externally supplied data (e.g., image data) Data, and supplies the rearranged data Data to the data driver 120.

The scan driver 110 receives the scan driving control signal SCS from the timing controller 150. After receiving the scan driving control signal SCS, the scan driver 110 generates scan signals, and supplies the scan signals to the scan lines S1 to Sn. For example, the scan driver 110 may sequentially supply the scan signals to the scan lines S1 to Sn.

In addition, the scan driver 110 generates light emission control signals in response to the scan driving control signal SCS, and supplies the light emission control signals to the light emission control lines E1 to En. For example, the scan driver 110 may sequentially supply the light emission control signals to the light emission control lines E1 to En. In this case, the light emission control signal supplied from the scan driver 110 may be set to have a wider width than that of the scan signal. For example, the light emission control signal to be supplied to an i-th light emission control line Ei may overlap with the scan signal to be supplied to an i−1-th scan line Si−1 and the scan signal to be supplied to an i-th scan line Si, wherein i is a natural number.

Additionally, the scan signal supplied from the scan driver 110 may be set to a voltage (e.g., a gate-on voltage) capable of turning on transistors included in the pixels 140, while the light emission control signal is set to a voltage (e.g., a gate-off voltage) capable of turning off the transistors of the pixels 140.

The data driver 120 receives the data driving control signal DCS and the data Data from the timing controller 150. The data driver 120 converts the data Data to a data signal (e.g., an analog data signal) using the data driving control signal DCS, and supplies the data signal to a corresponding one of the data lines D1 to Dm in synchronization with a corresponding scan signal.

The pixel portion 130 receives a first power ELVDD and a second power ELVSS, and supplies the first and second powers ELVDD and ELVSS to the pixels 140. The pixels 140 to which the first and second powers ELVDD and ELVSS are supplied, generate light having a luminance (e.g., a predetermined luminance) by controlling the amount of current flowing from the first power ELVDD to the second power ELVSS via an organic light emitting diode, in response to the data signals.

While FIG. 1 shows n scan lines S1 to Sn and n light emission control lines E1 to En, the present invention is not necessarily limited thereto. For example, one or more dummy scan lines and/or one or more dummy light emission control lines may be additionally provided, depending on a structure of each pixel 140. Further, each pixel 140 may be additionally connected to the scan line and/or the light emission control line of a previous horizontal line, depending on a circuit structure of each pixel 140.

In addition, FIG. 1 shows that the scan driver 110 is connected to the scan lines S1 to Sn and the light emission control lines E1 to En, but the present invention is not limited thereto. For example, the light emission control lines E1 to En may be connected to another driver (e.g., an additional driver) to receive the light emission control signals.

Figure 2:
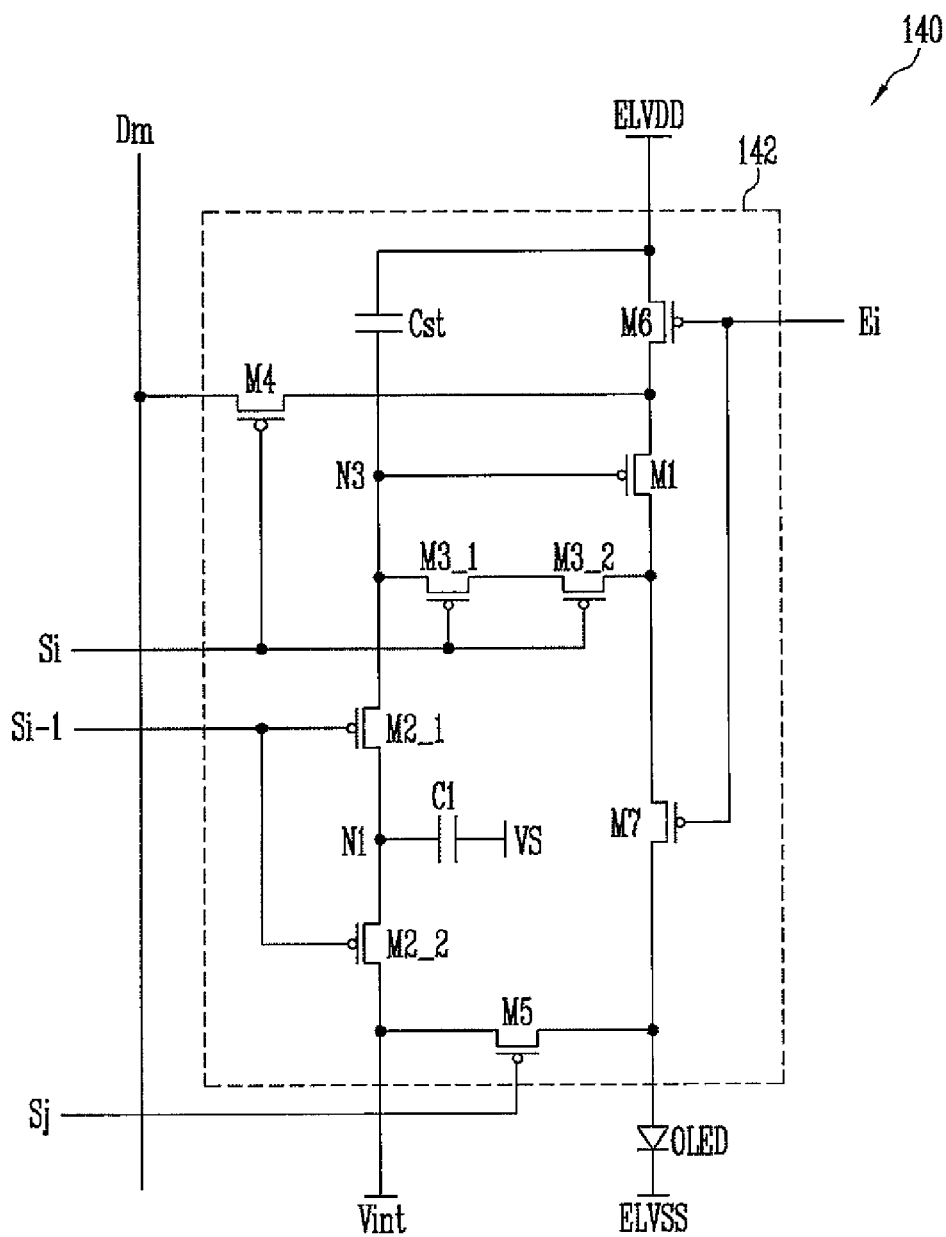
FIG. 2 is a circuit view of an exemplary embodiment of a pixel shown in FIG. 1.

FIG. 2 is a circuit view of an exemplary embodiment of the pixel shown in FIG. 1. In FIG. 2, the pixel 140 connected to an m-th data line Dm and arranged at an i-th horizontal line is illustrated for ease of description.

Referring to FIG. 2, the pixel 140 according to an exemplary embodiment of the present invention includes an organic light emitting diode OLED, and a pixel circuit 142 connected to the data line Dm, the scan lines Si−1 and Si, and the light emission control line E1, so as to control the amount of current flowing in the organic light emitting diode OLED.

An anode electrode of the organic light emitting diode OLED is connected to the pixel circuit 142, and a cathode thereof is connected to the second power ELVSS (e.g., a source of the second power ELVSS). The organic light emitting diode OLED generates light having a luminance (e.g., a predetermined luminance), depending on the amount of current supplied from the pixel circuit 142. In this case, the second power ELVSS may be set to a lower voltage than that of the first power ELVDD.

The pixel circuit 142 controls the amount of current flowing from the first power ELVDD to the second power ELVSS via the organic light emitting diode OLED, in response to the data signal. Thus, the pixel circuit 142 may include transistors M1 to M7, a first capacitor C1, and a storage capacitor Cst.

A first electrode of a first transistor M1 is connected to the first power ELVDD (e.g., a source of the first power ELVDD) via a sixth transistor M6, and a second electrode of the first transistor M1 is connected to the anode of the organic light emitting diode OLED via a seventh transistor M7. The first transistor M1 controls the amount of current flowing from the first power ELVDD to the second power ELVSS via the organic light emitting diode OLED, depending on a voltage of a third node N3 connected to a gate electrode of the first transistor M1.

A second transistor M2 (e.g., M2_1 and/or M2_2) is connected between the third node N3 and an initialization power (e.g., an initialization power source) Vint, and a gate electrode of the second transistor M2 (e.g., gate electrodes of M2_1 and M2_2) is connected to the i−1-th scan line Si−1. The second transistor M2 supplies a voltage of the initialization power Vint to the third node N3 by being turned on when a scan signal (e.g., an i−1-th scan signal) is supplied to the i−1-th scan line Si−1. In this case, the initialization power Vint may be set to a lower voltage than that of the data signal.

In addition, the second transistor M2 may include two transistors M2_1 and M2_2 or more that are connected in series, so that an undesired current may not flow between the third node N3 and the initialization power Vint. In FIG. 2, a structure in which two transistors M2_1 and M2_2 form the second transistor M2 is merely shown for convenience, and therefore, the present invention is not limited thereto.

A third transistor M3 (e.g., M3_1 and/or M3_2) is connected between the second electrode of the first transistor M1 and the third node N3, and a gate electrode of the third transistor M3 (e.g., gate electrodes of M3_1 and M3_2) is connected to an i-th scan line Si. The third transistor M3 electrically connects the second electrode of the first transistor M1 to the third node N3 by being turned on when a scan signal (e.g., an i-th scan signal) is supplied to the i-th scan line Si. Accordingly, the first transistor M1 is diode-connected when the third transistor M3 is turned-on.

In addition, the third transistor M3 may include two transistors M3_1 and M3_2 or more that are connected in series, so that an undesired current may not flow between the third node N3 and the second electrode of the first transistor M1. In FIG. 2, a structure in which two transistors M3_1 and M3_2 form the third transistor M3 is merely shown for convenience, and therefore, the present invention is not limited thereto.

A fourth transistor M4 is connected between the data line Dm and the first electrode of the first transistor M1, and a gate electrode of the fourth transistor M4 is connected to the i-th scan line Si. The fourth transistor M4 electrically connects the data line Dm to the first electrode of the first transistor M1 by being turned on when the scan signal (e.g., the i-th scan signal) is supplied to the i-th scan line Si.

A fifth transistor M5 is connected between the initialization power Vint and the anode electrode of the organic light emitting diode OLED, and a gate electrode of the fifth transistor M5 is connected to a j-th scan line Sj, wherein j is a natural number.

The fifth transistor M5 supplies a voltage of the initialization power Vint to the anode electrode of the organic light emitting diode OLED by being turned on when a scan signal (e.g., a j-th scan signal) is supplied to the j-th scan line Sj. In this case, the j-th scan line Sj receives the scan signal which overlaps with the light emission control signal to be supplied to the i-th light emission control line Ei. That is, the j-th scan line Sj may be set to one of the scan lines receiving the scan signal that overlaps the light emission control signal to be supplied to the i-th light emission control line Ei.

Accordingly, by including the fifth transistor M5, black-displaying capability of the pixels 140 may be improved. In more detail, when the fifth transistor M5 is turned on, an organic parasitic capacitor may be parasitically formed in the organic light emitting diode OLED discharged. In this case, the organic light emitting diode OLED may not emit light by a leakage current supplied from the first transistor M1, thereby improving the black-displaying capability of the pixels 140.

The sixth transistor M6 is connected between the first power ELVDD and the first electrode of the first transistor M1, and a gate electrode of the sixth transistor M6 is connected to the i-th light emission control line Ei. The sixth transistor M6 is turned off when the light emission control signal (e.g., the i-th light emission control signal) is supplied to the i-th light emission control line Ei, and the sixth transistor M6 may be turned on in other cases.

The seventh transistor M7 is connected between the second electrode of the first transistor M1 and the anode electrode of the organic light emitting diode OLED, and a gate electrode of the seventh transistor M7 is connected to the i-th light emission control line Ei. The seventh transistor M7 is turned off when the light emission control signal (e.g., the i-th light emission control signal) is supplied to the i-th light emission control line Ei, and the seventh transistor M7 may be turned on in other cases.

A storage capacitor Cst is connected between the first power ELVDD and the third node N3. The storage capacitor Cst may store a voltage corresponding to the data signal.

A first capacitor C1 is connected between a voltage power (e.g., a constant voltage power or power source) VS and a first node N1 that is connected between the second transistors M2_1 and M2_2. The first capacitor C1 may control a voltage at the third node N3, to maintain a uniform or substantially uniform voltage. More detailed description of the first capacitor C1 will be described later below.

In addition, the voltage source VS may be selected as a power source for maintaining the uniform or substantially uniform voltage during one frame period. For example, the voltage source VS may be selected as any one of the first power ELVDD, the second power ELVSS, and the initialization power Vint.

Figure 3:
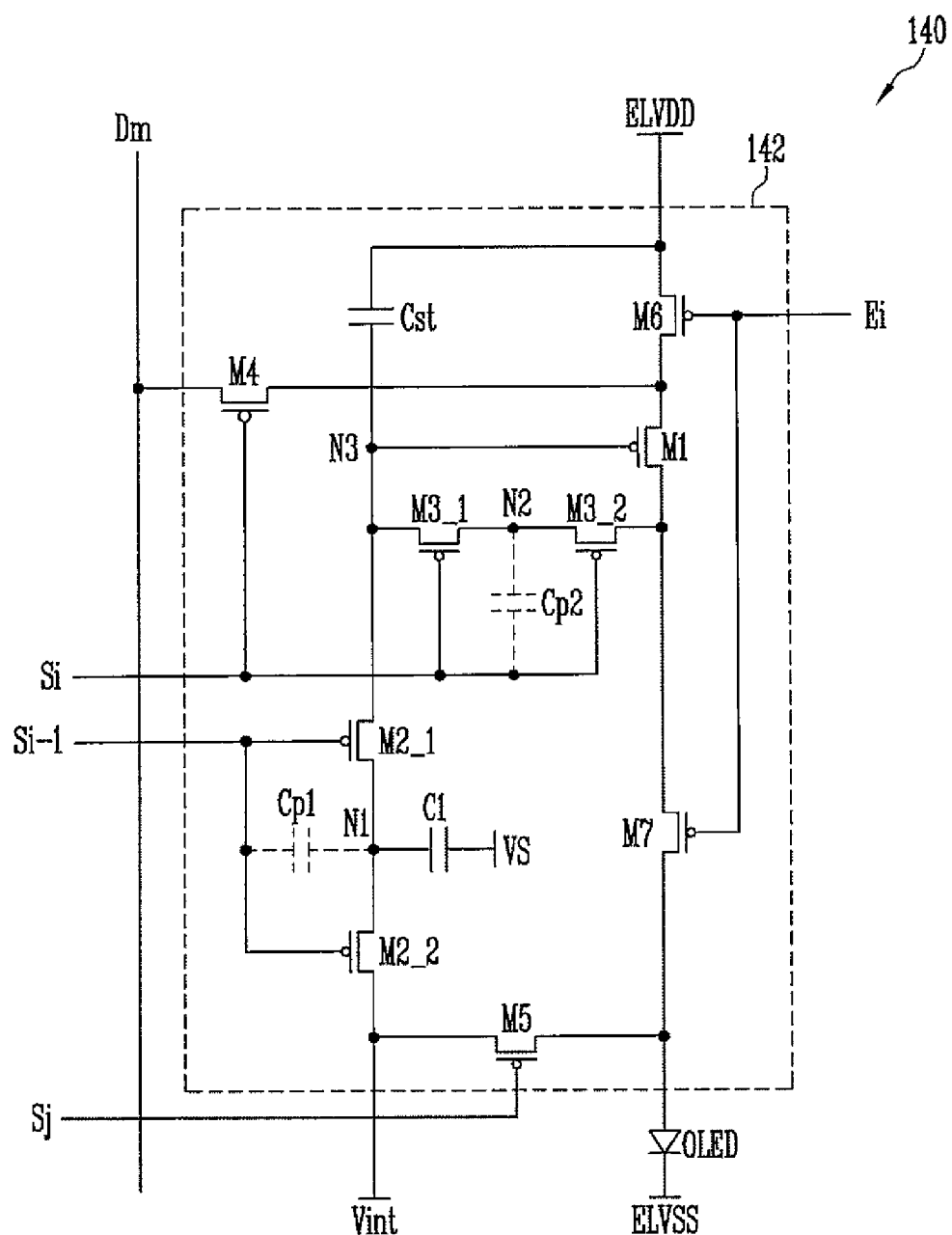
FIG. 3 is a circuit view of parasitic capacitors between second transistors and third transistors.

FIG. 3 is a view of parasitic capacitors between the second transistors and the third transistors.

Referring to FIG. 3, a first parasitic capacitor Cp1 may be formed between the first node N1 and the i−1-th scan line Si−1, and a second parasitic capacitor Cp2 may be formed between the scan line Si and a second node N2 between the third transistors M3_1 and M3_2. The first parasitic capacitor Cp1 increases a voltage of the first node N1 when the supply of the scan signal to the i−1-th scan line Si−1 stops. In other words, when a voltage of the i−1-th scan line Si−1 increases to a gate-off voltage from a gate-on voltage, the voltage of the first node N1 increases due to boosting caused by the parasitic capacitor Cp1.

The second parasitic capacitor Cp2 increases a voltage of the second node N2 when the supply of the scan signal to the i-th scan line Si stops. In other words, when a voltage of the i-th scan line Si increases to a gate-off voltage from a gate-on voltage, the voltage of the second node N2 increases due to boosting caused by the second parasitic capacitor Cp2.

Figure 4:
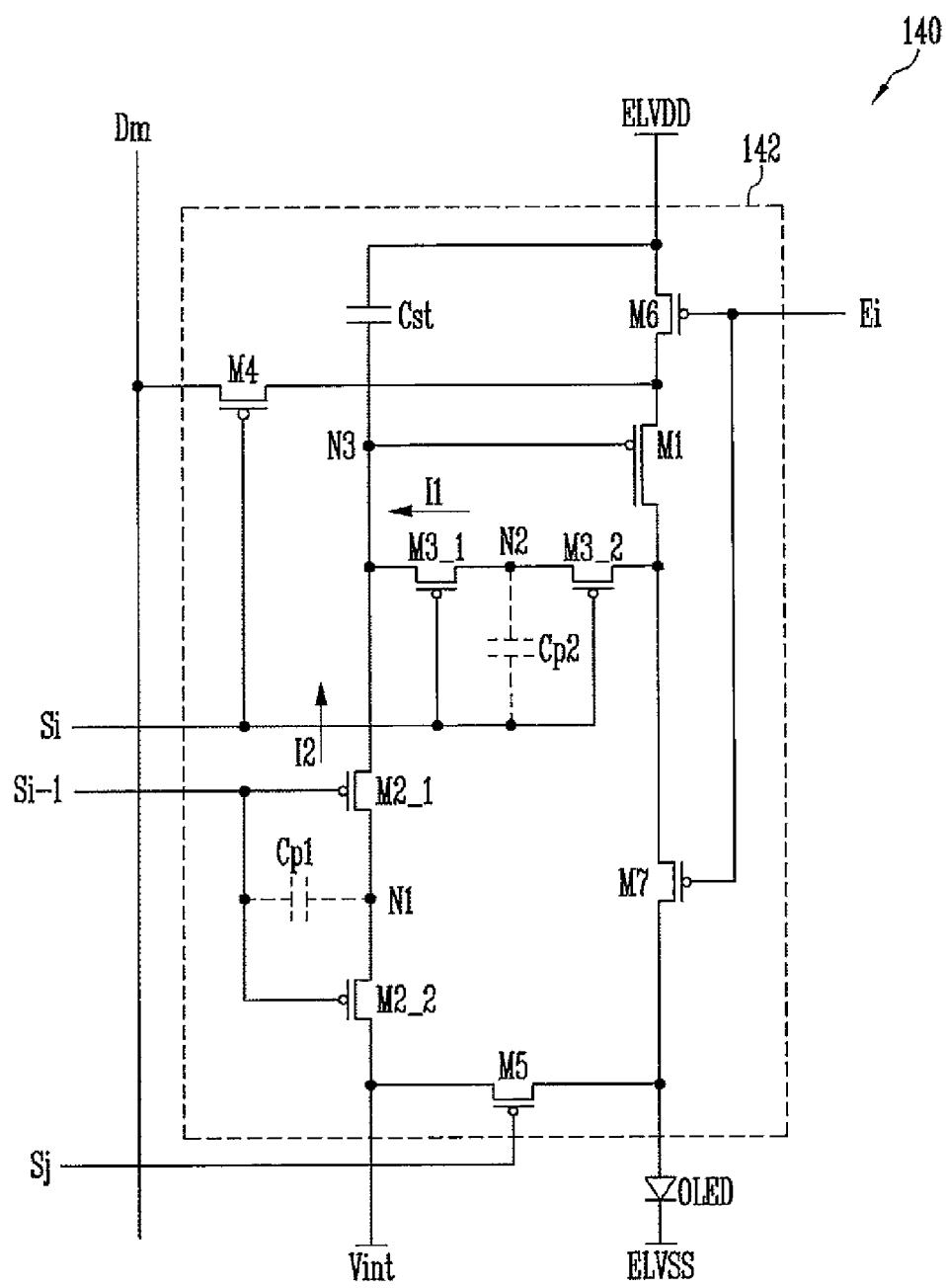
FIG. 4 is a circuit view of current flowing in a third node when a first capacitor shown in FIG. 2 is omitted.

Without the first capacitor C1 in this structure, a voltage of the third node N3 would change by the increased voltages of the first and second nodes N1 and N2. In other words, without the first capacitor C1 as shown in FIG. 4, a first current I1 is supplied from the second node N2 to the third node N3 during a light-emitting period, and a second current I2 is supplied from the first node N1 to the third node N3. In this case, a voltage of the third node N3 increases due to the first current I1 and the second current I2, and thus, the pixel 140 may fail to generate light of uniform or substantially uniform luminance during one frame period.

According to some embodiments of the present invention, however, the first capacitor C1 is provided between the first node N1 and the voltage source VS to prevent or substantially prevent this phenomenon. The first capacitor C1 may minimize or reduce a voltage rise at the first node N1 caused by the first parasitic capacitor Cp1. Accordingly, the first capacitor C1 may be set to have a capacitance greater than or equal to that of the first parasitic capacitor Cp1.

In more detail, when the first capacitor C1 is provided, the voltage rise rate at the first node N1 by the first parasitic capacitor Cp1 is set to be approximately proportional to Cp1/(Cp1+C1). In the case of controlling the capacitance of the first capacitor C1, the first node N1 may maintain or substantially maintain a lower voltage than that of the third node N3, even when the first parasitic capacitor Cp1 causes boosting at the first node N1.

Figure 5:
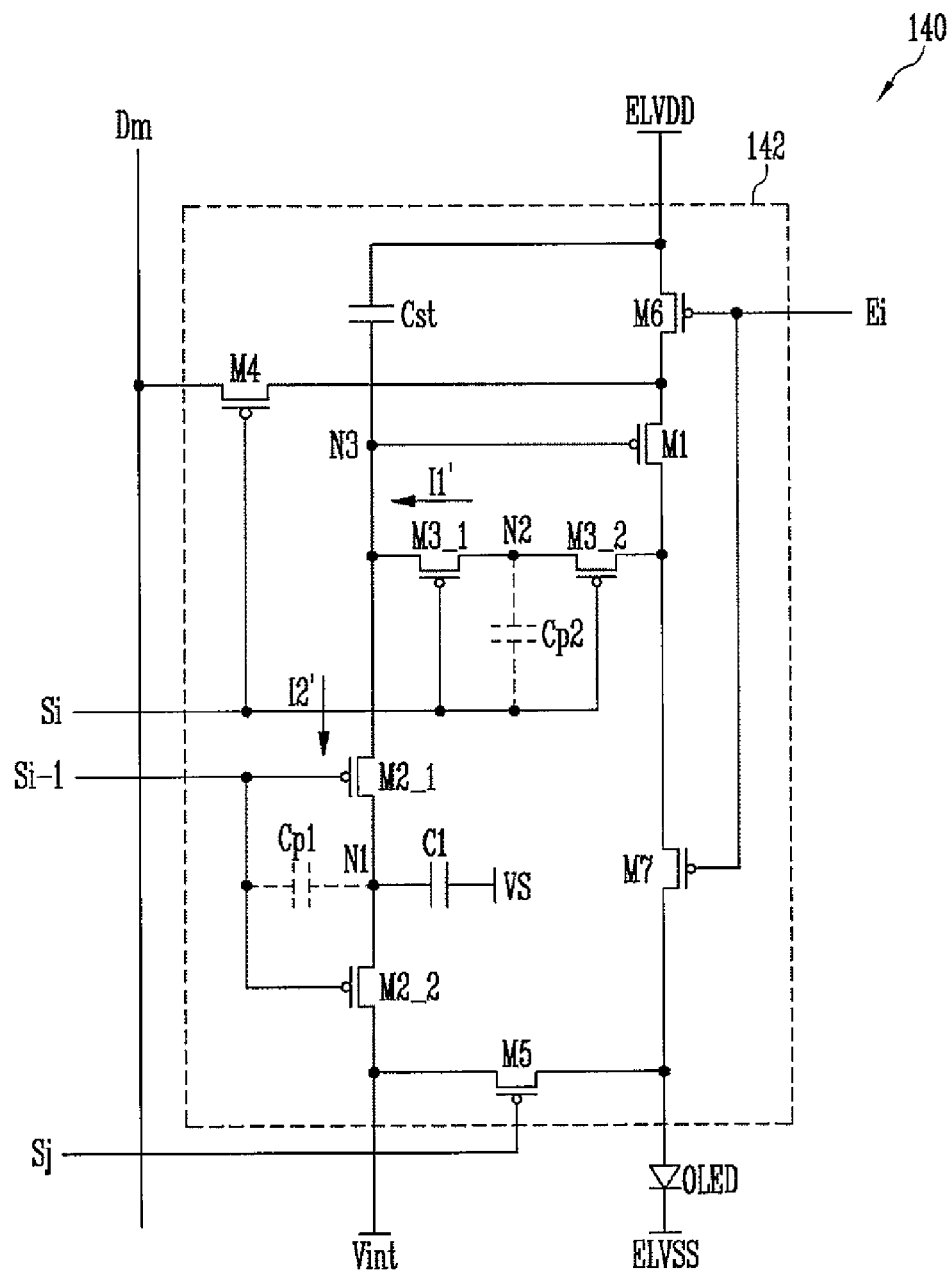
FIG. 5 is a circuit view of current flowing in and out from the third node when the first capacitor is provided as shown in FIG. 2.

As shown in FIG. 5, the first current I1' is supplied from the second node N2 to the third node N3 during the light-emitting period, and the second current I2' is supplied from the third node N3 to the first node N1. That is, during the light-emitting period, the first current I1' flows to the third node N3, while the second current I2' flows out from the third node N3. In this case, the third node N3 may maintain a uniform or a substantially uniform voltage corresponding to a current flowing therein and therefrom, and thus, the pixel 140 generates light of uniform or substantially uniform luminance during one frame period.

Figure 6:
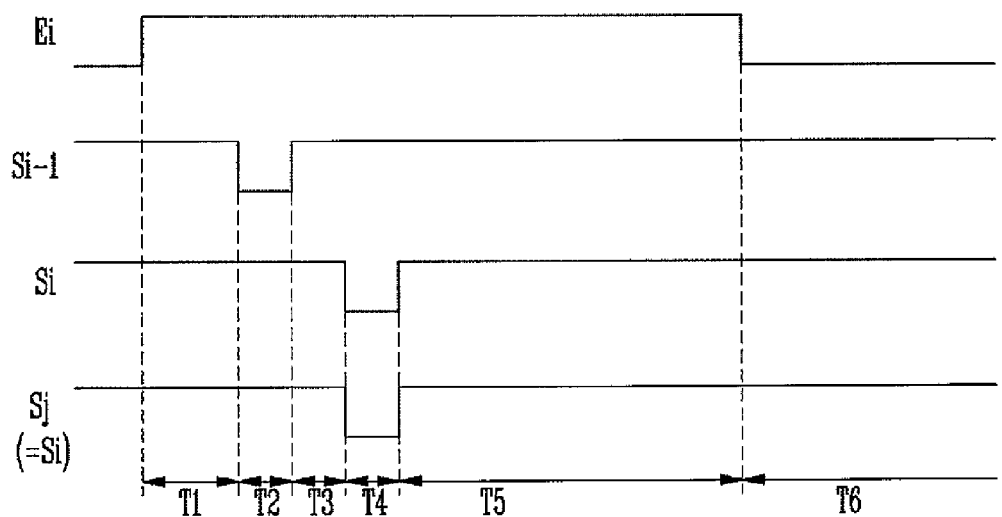
FIG. 6 is a view of an exemplary embodiment of driving waveforms supplied to the pixel shown in FIG. 2.

FIG. 6 is a view of an exemplary embodiment of driving waveforms supplied to the pixel shown in FIG. 2. In FIG. 6, the j-th scan line Sj and the i-th scan line Si are illustrated as the same scan lines for convenience.

Referring to FIG. 6, a light emission control signal (e.g., an i-th light emission control signal) is supplied to the i-th light emission control line Ei during the first period T1. The sixth transistor M6 and seventh transistor M7 are turned off when the light emission control signal is supplied to the i-th light emission control line Ei.

When the sixth transistor M6 is turned off, the first power ELVDD and the first electrode of the first transistor M1 are electrically cut off (e.g., electrically disconnected). When the seventh transistor M7 is turned off, the second electrode of the first transistor M1 and the anode electrode of the organic light emitting diode OLED are electrically cut off (e.g., electrically disconnected). Accordingly, the pixel 140 is set to a non-light emission state while the light emission control signal is supplied to the i-th light emission control line Ei.

During the second period T2, a scan signal (e.g., an i−1-th scan signal) is supplied to the i−1-th scan line Si−1. The second transistors M2_1 and M2_2 are turned on when the scan signal is supplied to the i−1-th scan line Si−1, and thus, an initialization power Vint is supplied to the third node N3. During the second period T2, a voltage of the first node N1 is set to a voltage of the initialization power Vint, and thus, a voltage corresponding to the initialization power Vint is stored in the first capacitor C1 and the first parasitic capacitor Cp1.

During the third period T3, the supply of the scan signal to the i−1-th scan line Si−1 is stopped. A voltage of the first node N1 increases due to boosting caused by the first parasitic capacitor Cp1, when the supply of the scan signal to the i−1-th scan line Si−1 is stopped. However, since the first capacitor C1 is set to a capacitance greater than or equal to that of the first parasitic capacitor Cp1, the voltage of the first node N1 increases to be higher (e.g., slightly higher) than that of the initialization power Vint.

During the fourth period T4, a scan signal (e.g., an i-th scan signal) is supplied to the i-th scan line Si (e.g., and thus, the j-th scan line Sj), thereby turning on the third transistors M3_1 and M3_2, the fourth transistor M4, and the fifth transistor M5.

When the fifth transistor M5 is turned on, a voltage of the initialization power Vint is supplied to the anode of the organic light emitting diode OLED, and thus, the organic light emitting diode OLED is initialized by the voltage of the initialization power Vint.

When the third transistors M3_1 and M3_2 are turned on, the third node N3 and the second electrode of the first transistor M1 are electrically connected. That is, the first transistor M1 is diode-connected when the third transistors M3_1 and M3_2 are turned on.

When the fourth transistor M4 is turned on, a data signal is supplied from the data line Dm to the first electrode of the first transistor M1. In this case, the first transistor M1 is turned on, since the third node N3 is initialized by the voltage of the initialization power Vint. When the first transistor M1 is turned on, a voltage that is obtained by subtracting an absolute value of a threshold voltage of the first transistor M1 from a voltage of the data signal is supplied to the third node N3. In this case, the storage capacitor Cst stores a voltage corresponding to the third node N3. Also, the second parasitic capacitor Cp2 stores a voltage corresponding to the data signal during the fourth period T4.

During the fifth period T5, the supply of the scan signal to the i-th scan line Si is stopped. A voltage of the second node N2 increases due to the second parasitic capacitor Cp2, when the supply of the scan signal to the i-th scan line Si is stopped. In this case, the voltage of the second node N2 is set to a higher voltage than that of the data signal.

During the sixth period T6, the supply of the light emission control signal to the light emission control line Ei is stopped, and thus, the sixth transistor M6 and the seventh transistor M7 are turned on. When the sixth transistor M6 is turned on, the first power ELVDD and the first electrode of the first transistor M1 are electrically connected. When the seventh transistor M7 is turned on, the second electrode of the first transistor M1 and the anode electrode of the organic light emitting diode OLED are electrically connected. In this case, the first transistor M1 controls the amount of current flowing from the first power ELVDD to second power ELVSS via the organic light emitting diode OLED, in response to the voltage of the third node N3. As a result, the organic light emitting diode OLED generates light having a luminance (e.g., a predetermined luminance) corresponding to the amount of current supplied from the first transistor M1 during the sixth period T6.

Meanwhile, during the sixth period T6, the second node N2 is set to a higher voltage than that of the third node N3, and the first node N1 is set to a lower voltage than that of the third node N3. Accordingly, the first current I1' is supplied to the third node N3 from the second node N2, and the second current I2' is supplied to the first node N1 from the third node N3 during the sixth period T6.

That is, during the sixth period T6, the first current I1' flows to the third node N3, and the second current I2' flows out from the third node N3. In this case, the third node N3 may maintain or substantially maintain a uniform or an approximately uniform voltage for a current flowing therein and therefrom during the sixth period T6, and thus, the pixel 140 generates light of uniform or substantially uniform luminance during one frame period.

Figure 7:
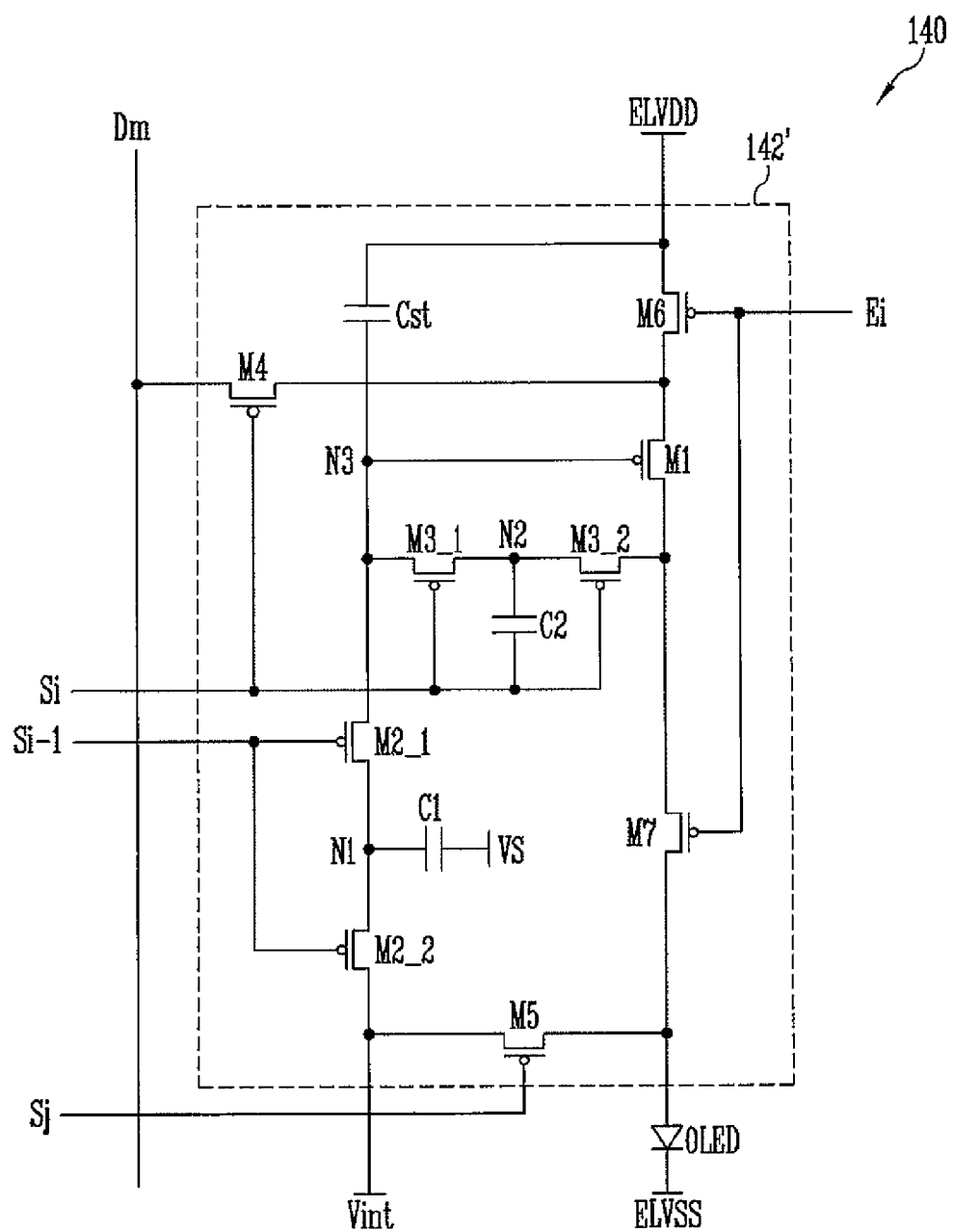
FIG. 7 is a circuit view of another embodiment of the pixel shown in FIG. 1.

FIG. 7 is a circuit view of another embodiment of the pixel shown in FIG. 1. The same or substantially the same components illustrated in FIG. 2 that are also illustrated in FIG. 7 are designated by the same reference numerals, and detailed descriptions thereof will be omitted.

Referring to FIG. 7, the pixel 140 according to another exemplary embodiment of the present invention includes an organic light emitting diode OLED, and a pixel circuit 142' for controlling the amount of current to be supplied to the organic light emitting diode OLED.

An anode electrode of the organic light emitting diode OLED is connected to the pixel circuit 142', and a cathode thereof is connected to a second power (e.g., a second power supply or power source) ELVSS. The organic light emitting diode OLED generates light having a luminance (e.g., a predetermined luminance) corresponding to the amount of current supplied from the pixel circuit 142'.

The pixel circuit 142' includes a second capacitor C2 connected between a second node N2 and an i-th scan line Si. This second capacitor C2 is separately provided from a second parasitic capacitor Cp2.

In more detail, in the case where the second parasitic capacitor Cp2 is provided between the second node N2 and the i-th scan line Si, and the second capacitor C2 is not provided, it is difficult to control the amount of current flowing from the second node N2 to the third node N3. Therefore, according to some embodiments of the present invention, the second capacitor C2 is additionally provided between the second node N2 and the i-th scan line Si, and the second capacitor C2 controls a capacitance of the second parasitic capacitor Cp2, so that a desired current may flow from the second node N2 to the third node N3.

Therefore, a current flowing into the third node N3 from the second node N2 (e.g., I1') and a current flowing from the third node N3 to the first node N1 (e.g., I2') may be set to be equal or substantially equal to each other, by controlling capacitances of the first and second capacitors C1 and C2. When the current flowing to the third node N3 and the current flowing out from the third node N3 are equal or substantially equal to each other, the third node N3 may stably maintain a desired voltage.

Figure 8A:
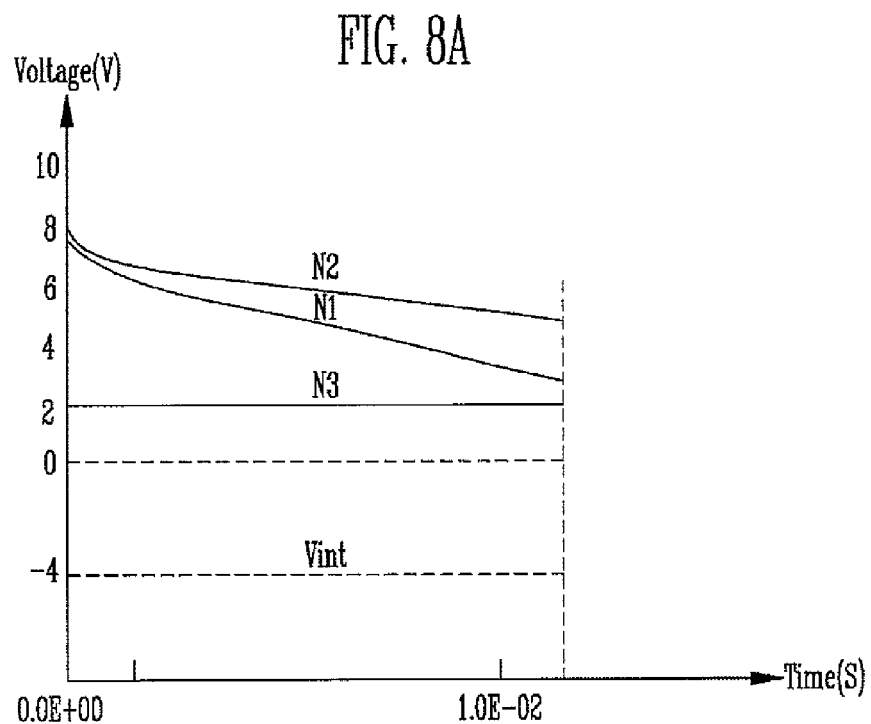
FIG. 8A and FIG. 8B are simulation results of voltages measured at the respective nodes.
Figure 8B:
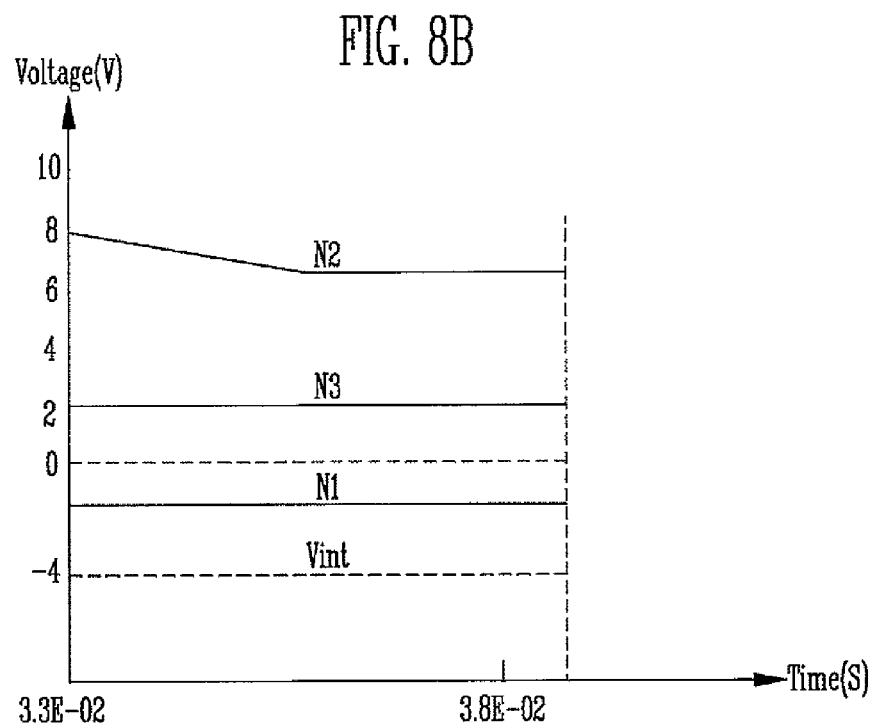

FIG. 8A and FIG. 8B are simulation results of voltages measured at the respective nodes. FIG. 8A shows the case in which the first capacitor C1 is omitted from the pixel circuit 142 of FIG. 5, while FIG. 8B shows the case in which the first capacitor C1 is included in the pixel circuit 142 as shown in FIG. 5.

In the case where the first capacitor C1 is omitted from the pixel circuit 142, voltages of the second node N2 and the first node N1 are higher than that of the third node N3, as shown in FIG. 8A. However, in the case where the first capacitor C1 is included in the pixel circuit 142, the voltage of the second node N2 is higher than that of the third node N3, and the voltage of the first node N1 is lower than that of the third node N3, as shown in FIG. 8B.

Figure 9:
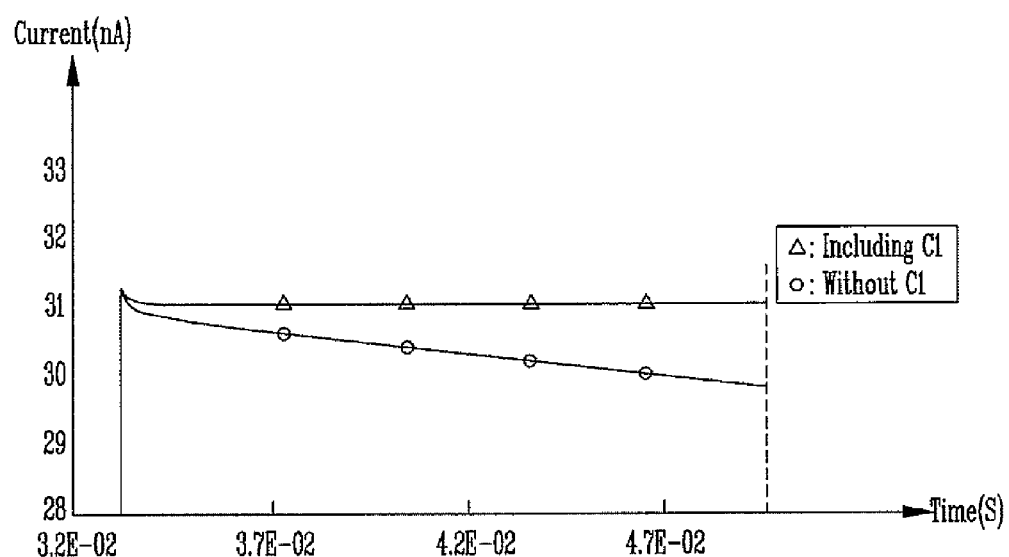
FIG. 9 is a graph of an amount of current flowing in the organic light emitting diode during one frame period.

FIG. 9 is a graph showing the amount of current supplied to the organic light emitting diode OLED during one frame period. FIG. 9 shows two cases: one case is a pixel circuit without the first capacitor C1, and the other case is a pixel circuit including the first capacitor C1, according to some embodiments of the present invention.

Referring to FIG. 9, in the pixel circuit without the first capacitor C1, the amount of current supplied from the pixel circuit to the organic light emitting diode OLED changes as time passes, according to a voltage rise occurring at the gate electrode of the driving transistor. That is, the voltage of the gate electrode of the driving transistor increases as time passes, thereby decreasing the amount of current supplied to the organic light emitting diode OLED.

In contrast, in the pixel circuit including the first capacitor C1 according to some embodiments of the present invention, the voltage of the gate electrode of the driving transistor is nearly uniformly maintained, and thus, the amount of current supplied to the organic light emitting diode OLED is also nearly uniformly maintained. As a result, the pixel circuit according to some embodiments of the present invention may generate light having uniform or substantially uniform luminance during one frame period.

In the figures, the transistors are illustrated as PMOS transistors for convenience, but the present invention is not limited thereto. In other words, in some embodiments, one or more of the transistors may be NMOS transistors.

In addition, the organic light emitting diode OLED generates light of various colors including red, green, and blue according to the amount of current supplied from the driving transistor, but the present invention is not limited thereto. For example, the organic light emitting diode OLED may generate white light corresponding to the amount of current supplied from the driving transistor. In this case, a color image is implemented by an additional color filter, etc.

Example embodiments have been disclosed herein, and although specific terms are employed, they are used and are to be interpreted in a generic and descriptive sense only, and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments, unless otherwise specifically indicated. Accordingly, it will be understood by those of skill in the art that various changes in form and details may be made without departing from the spirit and scope of the present disclosure as set forth in the following claims, and their equivalents.

What is claimed is:

1. A pixel comprising:
an organic light emitting diode including a cathode electrode connected to a second power source;
a first transistor including a first electrode connected to a first power source, and configured to control an amount of current flowing from the first power source to the second power source via the organic light emitting diode in response to a data signal;
a plurality of second transistors connected in series between a gate electrode of the first transistor and an initialization power source, and configured to be turned on when a scan signal is supplied to an i–1-th (i is a natural number) scan line; and
a first capacitor connected between a voltage source and a first node, the first node being between the plurality of second transistors,
wherein the first capacitor is configured to reduce a voltage rise at the first node caused by a parasitic capacitor formed between the first node and the i–1-th scan line.

2. The pixel of claim 1, wherein the first capacitor has a capacitance higher than that of a parasitic capacitor formed between the first node and the i–1-th scan line.

3. The pixel of claim 1, wherein the voltage source is set to any one from among the first power source, the second power source, and the initialization power source.

4. The pixel of claim 1, further comprising:
a plurality of third transistors connected in series between the gate electrode of the first transistor and a second electrode of the first transistor, and configured to be turned on when a scan signal is supplied to an i-th scan line.

5. The pixel of claim 4, further comprising:
a second capacitor connected between the i-th scan line and a second node, the second node being between the plurality of third transistors.

6. A pixel comprising:
an organic light emitting diode including a cathode electrode connected to a second power source;
a first transistor including a first electrode connected to a first power source, and configured to control an amount of current flowing from the first power source to the second power source via the organic light emitting diode in response to a data signal;
a plurality of second transistors connected in series between a gate electrode of the first transistor and an initialization power source, and configured to be turned on when a scan signal is supplied to an i–1-th (i is a natural number) scan line;
a first capacitor connected between a voltage source and a first node, the first node being between the plurality of second transistors;
a fourth transistor connected to a data line and the first electrode of the first transistor, and configured to be turned on when a corresponding scan signal is supplied to an i-th scan line;
a fifth transistor connected to the initialization power source and an anode electrode of the organic light emitting diode, and configured to be turned on when a scan signal is supplied to a j-th (j is a natural number) scan line;
a sixth transistor connected to the first power source and the first electrode of the first transistor, and configured to be turned off when a light emission control signal is supplied to an i-th light emission control line;
a seventh transistor connected to the second electrode of the first transistor and the anode electrode of the organic light emitting diode, and configured to be turned off when the light emission control signal is supplied to the i-th light emission control line; and
a storage capacitor connected between the gate electrode of the first transistor and the first power source.

7. The pixel of claim 6, wherein the scan signal supplied to the j-th scan line overlaps with the light emission control signal supplied to the i-th light emission control line.

8. An organic light emitting display device, comprising:
a scan driver configured to supply scan signals to scan lines and light emission control signals to light emission control lines;
a data driver configured to supply data signals to data lines; and
pixels arranged at crossing regions of the scan lines and the data lines, each of the pixels arranged at an i-th (i is a natural number) horizontal line from among the pixels comprising:
an organic light emitting diode including a cathode electrode connected to a second power source;
a first transistor including a first electrode connected to a first power source, and configured to control an amount of current flowing from the first power source to the second power source via the organic light emitting diode in response to a corresponding data signal;

a plurality of second transistors connected in series between a gate electrode of the first transistor and an initialization power source, and configured to be turned on when a corresponding scan signal is supplied to an i−1-th (where i is a natural number) scan line; and a first capacitor connected between a voltage source and a first node, the first node being between the plurality of second transistors, wherein the first capacitor is configured to reduce a voltage rise at the first node caused by a parasitic capacitor formed between the first node and the i−1-th scan line.

9. The organic light emitting display device of claim 8, wherein the first capacitor has a capacitance higher than that of a parasitic capacitor formed between the first node and the i−1-th scan line.

10. The organic light emitting display device of claim 8, wherein the voltage source is set to any one from among the first power source, the second power source, and the initialization power source.

11. The organic light emitting display device of claim 8, wherein the scan driver is configured to sequentially supply the scan signals having gate-on voltages to the scan lines, and to sequentially supply the light emission control signals having gate-off voltages to the light emission control lines.

12. The organic light emitting display device of claim 11, wherein the scan driver is configured to supply the light emission control signals to an i-th light emission control line to overlap with the scan signals supplied to the i−1-th scan line and an i-th scan line.

13. The organic light emitting display device of claim 8, wherein each of the pixels arranged at the i-th horizontal line further comprises a plurality of third transistors connected in series between a gate electrode of the first transistor and a second electrode of the first transistor, and configured to be turned on when a corresponding scan signal is supplied to an i-th scan line.

14. The organic light emitting display device of claim 13, wherein each of the pixels arranged at the i-th horizontal line further comprises a second capacitor connected between the i-th scan line and a second node, the second node being between the plurality of third transistors.

15. The organic light emitting display device of claim 8, wherein each of the pixels arranged at the i-th horizontal line further comprises:
a fourth transistor connected to a data line and the first electrode of the first transistor, and configured to be turned on when a corresponding scan signal is supplied to an i-th scan line;
a fifth transistor connected to the initialization power source and an anode electrode of the organic light emitting diode, and configured to be turned on when a corresponding scan signal is supplied to a j-th (j is a natural number) scan line;
a sixth transistor connected to the first power source and the first electrode of the first transistor, and configured to be turned off when a light emission control signal is supplied to an i-th light emission control line;
a seventh transistor connected to the second electrode of the first transistor and the anode electrode of the organic light emitting diode, and configured to be turned off when the light emission control signal is supplied to the i-th light emission control line; and
a storage capacitor connected between the gate electrode of the first transistor and the first power source.

16. The organic light emitting display device of claim 15, wherein the scan signal supplied to the j-th scan line overlaps with the light emission control signal supplied to the i-th light emission control line.

\* \* \* \* \*